United States Patent
Lu (10) Patent No.: US 8,512,055 B2
(45) Date of Patent: Aug. 20, 2013

(54) FIXING DEVICE FOR POWER MODULE

(75) Inventor: Hung-Chun Lu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 135 days.

(21) Appl. No.: 13/300,639

(22) Filed: Nov. 20, 2011

(65) Prior Publication Data

US 2013/0034980 A1    Feb. 7, 2013

(30) Foreign Application Priority Data

Aug. 5, 2011  (TW) .............................. 100127873 A (51) Int. Cl.
*H01R 13/62*   (2006.01)

(52) U.S. Cl.
USPC .......................................... 439/160; 439/347

(58) Field of Classification Search
USPC ................. 439/153–160, 347; 361/683, 685
See application file for complete search history.

(56) References Cited

U.S. PATENT DOCUMENTS

| | | | |
|---|---|---|---|
| 6,452,792 B1 * | 9/2002 | Chen | 361/679.35 |
| 8,059,419 B2 * | 11/2011 | Lu | 361/759 |
| 8,218,315 B2 * | 7/2012 | Lu | 361/679.58 |
| 2006/0030187 A1 * | 2/2006 | Hsiao et al. | 439/160 |
| 2007/0002002 A1 * | 1/2007 | Jiang et al. | 345/102 |
| 2007/0025070 A1 * | 2/2007 | Jiang et al. | 361/680 |
| 2007/0077788 A1 * | 4/2007 | Jiang et al. | 439/71 |
| 2012/0190224 A1 * | 7/2012 | Wu | 439/157 |

* cited by examiner

*Primary Examiner* — Renee Luebke
*Assistant Examiner* — Larisa Tsukerman
(74) *Attorney, Agent, or Firm* — Altis Law Group, Inc.

(57) ABSTRACT

A fixing device for fixing a power module includes a supporting rack, a latching member, and a resilient member connected between the supporting rack and the latching member. The supporting rack includes a base forming a hook engaging in a latching hole defined in the power module. A receiving hole is defined in the base. A protrusion extends down from the base. A slope facing the receiving hole is formed on the protrusion. A resilient tongue extends from the sliding plate. An abutting block extends down from a distal end of the tongue. When disassembling the power module, the latching member is slid relative to the base. The hook is disengaged from the latching hole. The slope abuts against the abutting block. The abutting block moves upward. The tongue is deformed to push up the power module to separate the power module from the supporting rack.

16 Claims, 8 Drawing Sheets

# FIXING DEVICE FOR POWER MODULE

BACKGROUND

1. Technical Field

The present disclosure relates to a device for fixing a power module.

2. Description of Related Art

In an electronic device, such as a computer or a server, a power module is usually fixed on a chassis of the electronic device by screws. However, it is time-consuming and often difficult to disassemble the power module from the electronic device when the power module needs to be replaced.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
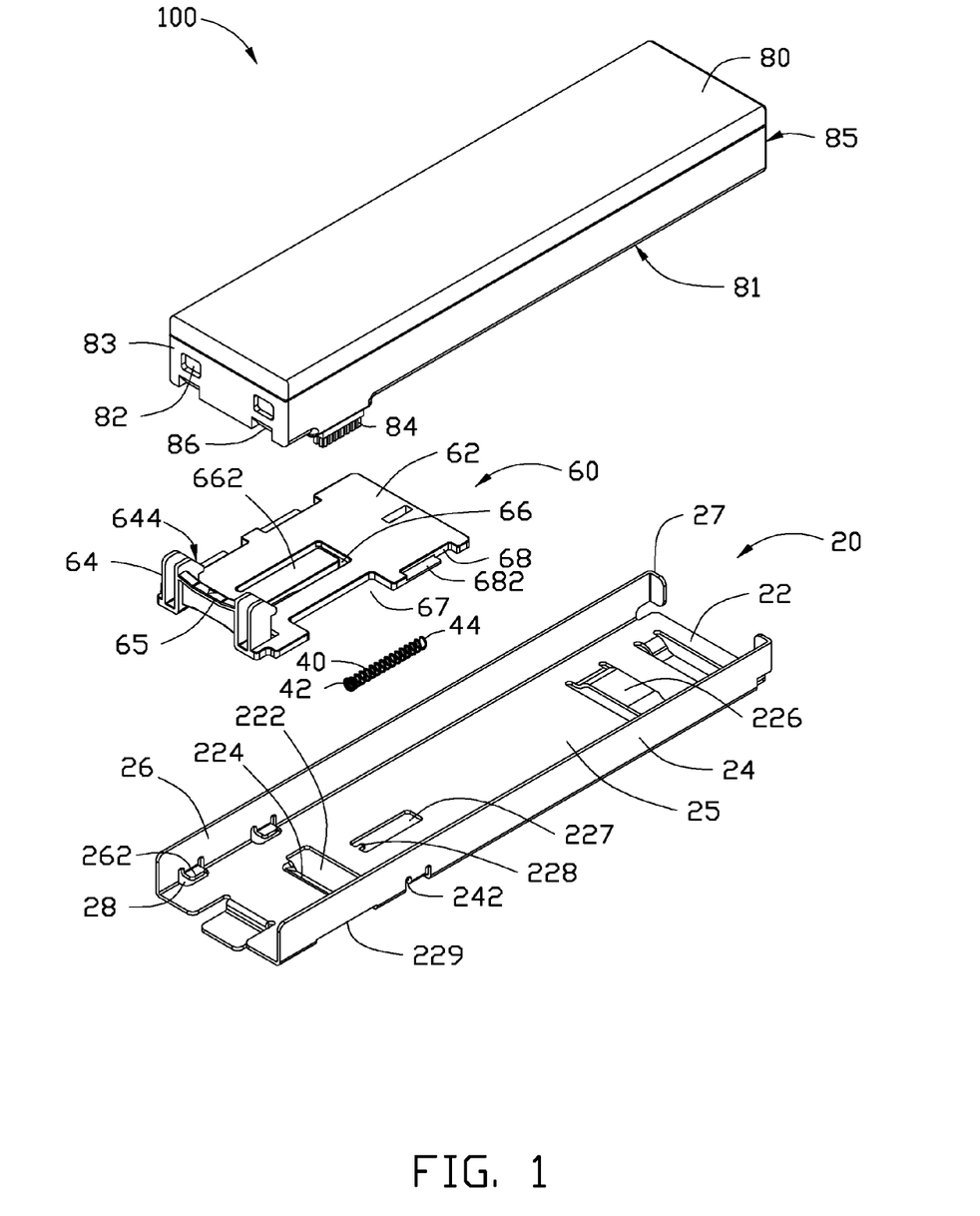
FIG. 1 is an exploded, isometric view of an exemplary embodiment of a fixing device, together with a power module.
Figure 2:
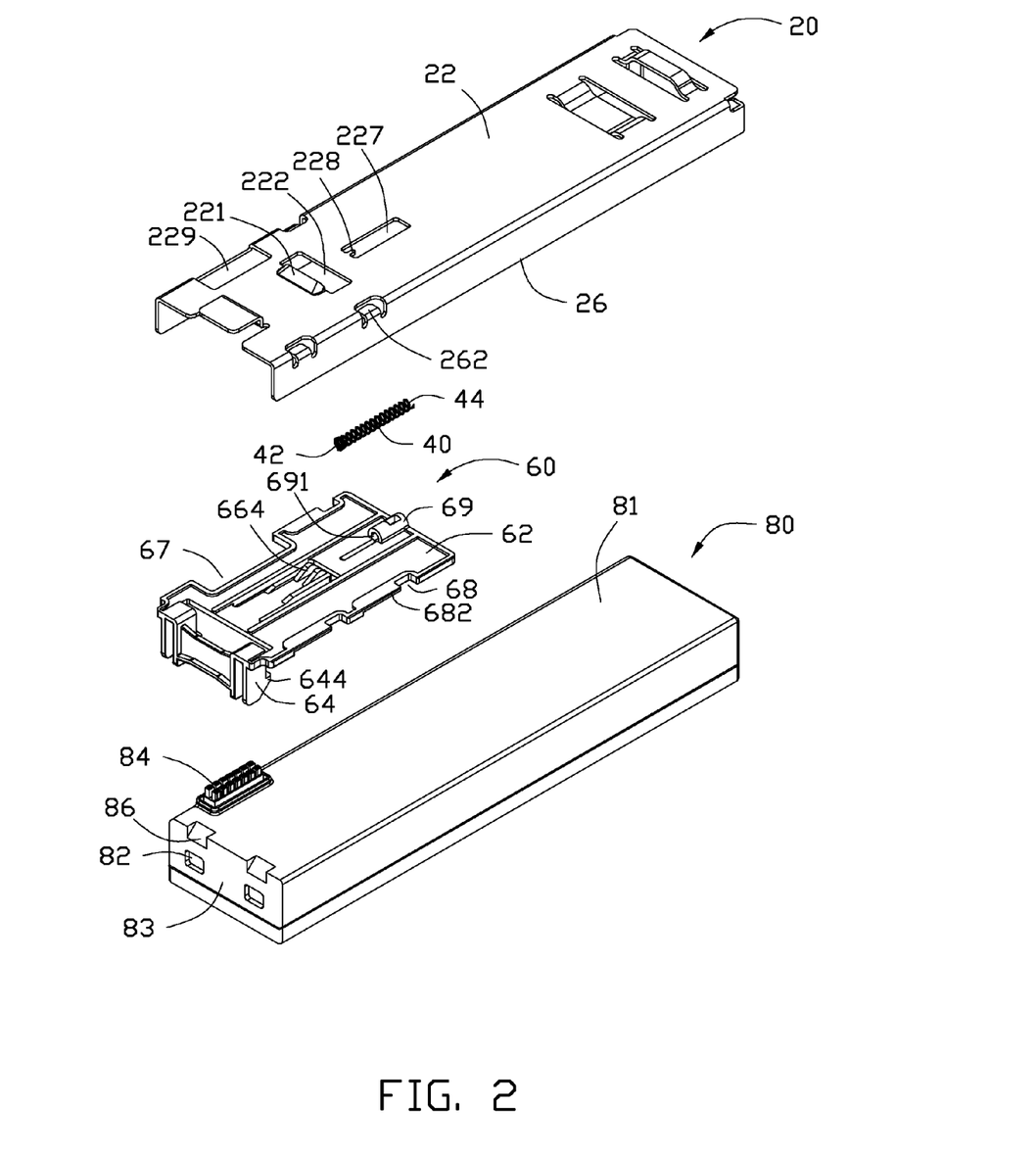
FIG. 2 is an inverted view of FIG. 1

Referring to FIG. 1 and FIG. 2, an exemplary embodiment of a fixing device 100 for a power module 80 includes a supporting rack 20, a resilient member 40, and a latching member 60.

The power module 80 is rectangular, and includes a bottom wall 81, a first end wall 83, and a second end wall 85 opposite to the first end wall 83. The first end wall 83 defines two spaced latching holes 82. Two triangular guiding slots 86 are defined in a junction of the first end wall 83 and the bottom wall 81, above the corresponding latching holes 82. A male connector 84 is formed on a side of the bottom wall 81, adjacent to the first end wall 83.

The supporting rack 20 is substantially U-shaped. The supporting rack 20 includes a rectangular base 22, a first sidewall 24 perpendicularly extending up from a first side of the base 22, a second sidewall 26 perpendicularly extending up from a second side of the base 22 opposite to the first sidewall 24, and two blocking pieces 27 perpendicularly extending from corresponding ends of the first and second sidewalls 24 and 26 toward each other. The base 22, the first sidewall 24, the second sidewall 26, and the blocking pieces 27 cooperatively define a receiving space 25.

The base 22 defines a rectangular receiving hole 222 in a first end of the base 22, a long guiding slot 227 at an inner side of the receiving hole 222, and a rectangular through hole 229 at an outer side of the receiving hole 222 and adjacent to the first sidewall 24. A wedge-shaped protrusion 221 extends down from the base 22, at the outer side of the receiving hole 222. A slope 224 facing the receiving hole 222 is formed on the protrusion 221. The guiding slot 227 extends along the lengthwise direction of the base 22. A first pin 228 protrudes into the guiding slot 227 from an end wall bounding the guiding slot 227 adjacent to the receiving hole 222. A supporting block 226 extends up from a second end of the base 22 opposite to the first end. A tab 242 extends in from the first sidewall 24 adjacent to the through hole 229, and two spaced tabs 262 extend in from the second sidewall 26 adjacent to the receiving hole 222. The tabs 242 and 262, and the base 22 cooperatively bound a slide slot 28.

In the embodiment, the resilient member 40 is a coil spring, and includes a first end 42, and a second end 44 opposite to the first end 42.

The latching member 60 includes a rectangular sliding plate 62, two spaced hooks 64 extending up from a first end of the sliding plate 62, and an operation portion 65 formed between the hooks 64. A guiding surface 644 is formed on a top of the hook 64, facing a second end of the sliding plate 62 opposite to the first end.

The sliding plate 62 defines a receiving slot 66, adjacent to the operation portion 65 and extending along the lengthwise direction of the sliding plate 62. A resilient tongue 662 extends into the receiving slot 66 from an end wall bounding the receiving slot 66 adjacent to the first end of the sliding plate 62. Two wedge-shaped abutting blocks 664 extend down from a distal end of the tongue 662. The sliding plate 62 defines an opening 67 and a cutout 68 in a first side of the sliding plate 62, and defines two spaced cutouts 68 in a second side of the sliding plate 62 opposite to the first side. A sliding tab 682 extends out from an end of a bottom wall of each cutout 68 adjacent to the first end of the sliding plate 62. A semi-cylindrical installing portion 69 extends down from a second end of the sliding plate 62. An inserting hole 691 is axially defined in an end of the installing portion 69 opposite to the second end of the sliding plate 62. A second pin 692 (shown FIG. 4) axially extends from an end wall bounding the inserting hole 691 adjacent to the second end of the sliding plate 62. In the embodiment, the latching member 60 is made of resilient material, such as rubber or plastic.

The supporting rack 20 is mounted on a chassis of an electronic device by screws or other connecting means. A female connector of the electronic device aligns with the through hole 229 of the supporting rack 20.

Figure 3:
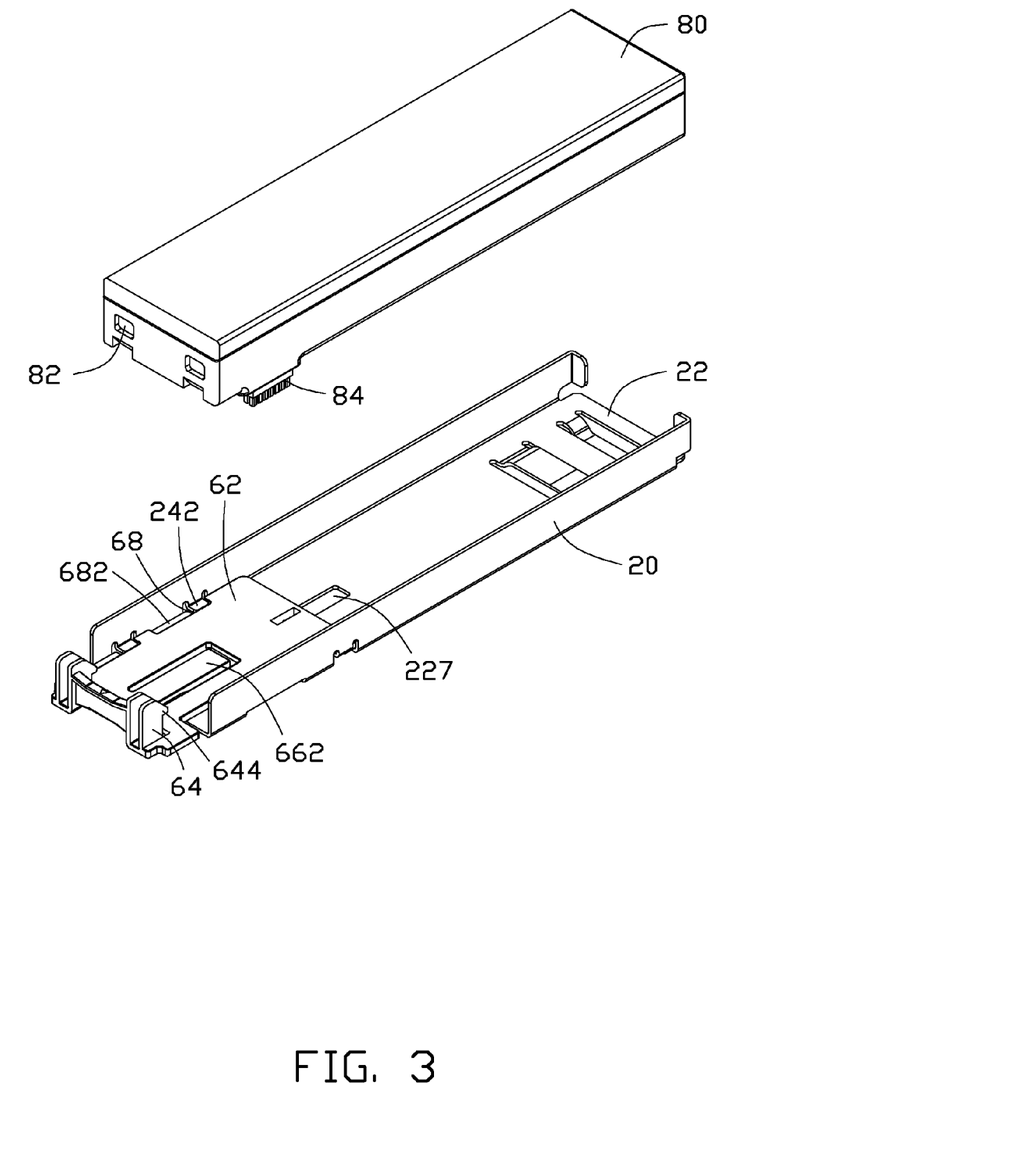
FIG. 3 is a partially assembled, isometric view of FIG. 1.

Referring to FIG. 3, in assembly, the second end 44 of the resilient member 40 is inserted into the inserting hole 691 of the latching member 60, and fits about the second pin 692. The latching member 60 is received in the receiving space 25. The abutting block 664 is received in the receiving hole 222. The installing portion 69 is slidably received in the guiding slot 227. The first end 42 of the resilient member 40 is fitted about the first pin 228 of the supporting rack 20. The operation portion 65 is pulled to move away from the supporting rack 20, to deform the resilient member 40, until the tabs 242 and 262 are inserted into the corresponding cutout 68. After the operation portion 65 is released, the resilient member 40 is restored to urge the latching member 60 to move back. The sliding tabs 682 are slid in the slide slot 28 toward the blocking piece 27, until the tabs 242 and 262 abut against the end wall of the corresponding cutouts 68. The abutting block 664 is received in the receiving hole 222. The opening 67 aligns with the through hole 229 of the supporting rack 20.

Figure 4:
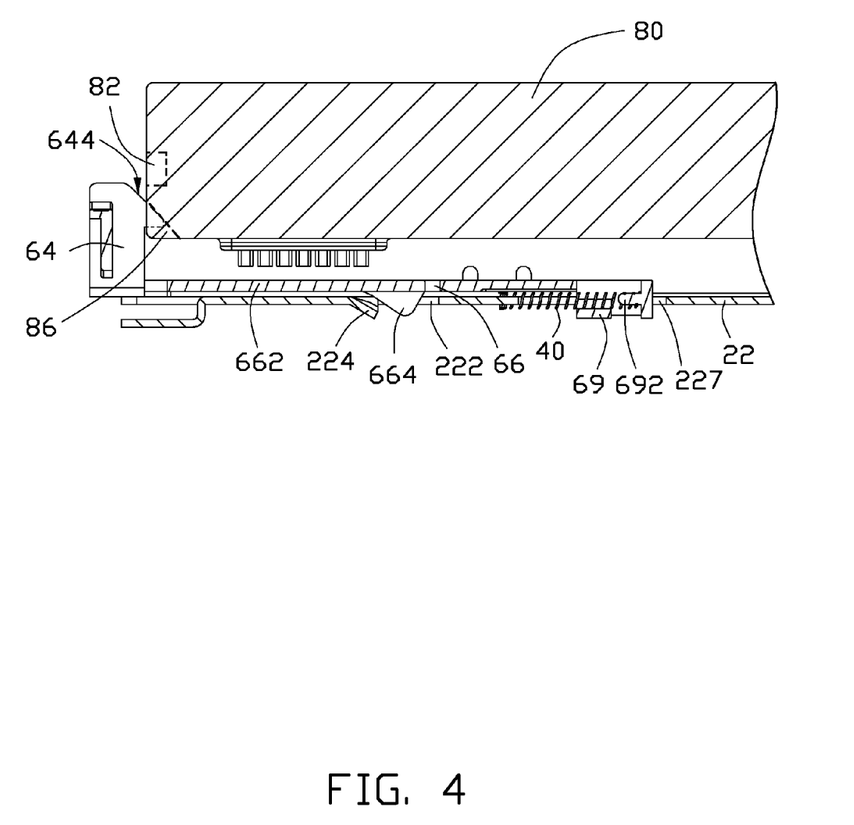
FIGS. 4-6 are partial, assembled, and cross-sectional views of the fixing device and the power module of FIG. 3, but shows different processes of assembly.
Figure 5:
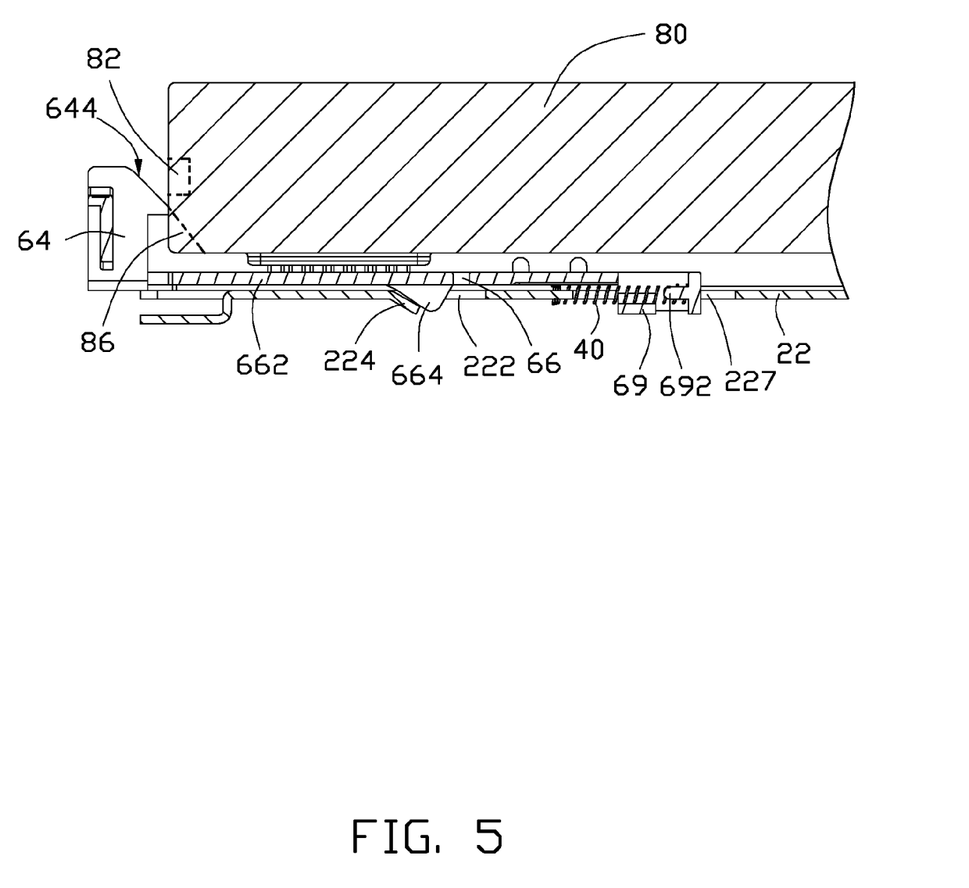
Figure 6:
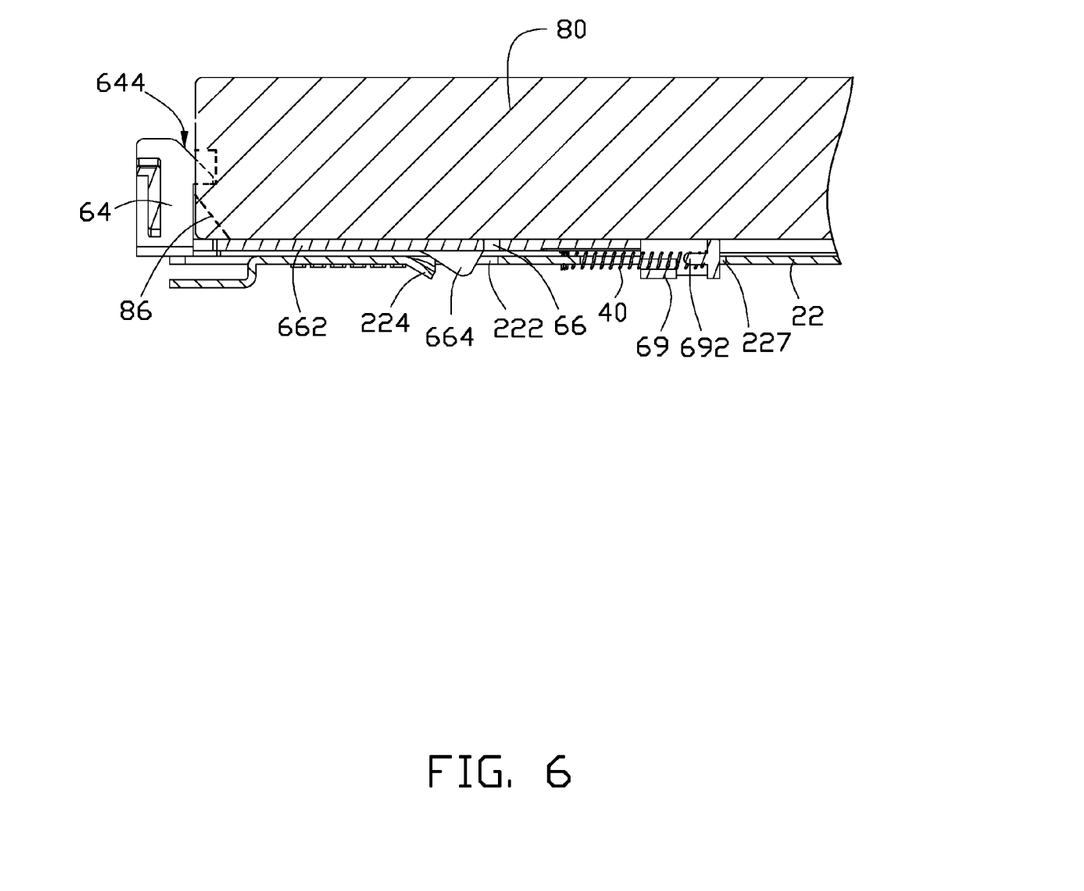

Referring to FIGS. 4-6, when assembling the power module 80, the male connector 84 is aligned with the opening 67. The second end wall 85 is blocked by the blocking pieces 27. The power module 80 is pressed down to be received in the receiving space 25. The guiding surfaces 644 of the hooks 64 slidably abut against bottom walls of the corresponding guiding slots 86. The latching member 60 is moved away from the blocking pieces 27, thereby deforming the resilient member 40, until the hooks 64 slidably abut against the first end wall 83. The power module 80 is pressed down further such that the hooks 64 are aligned with the corresponding latching holes 82. The resilient member 40 is restored, to move the latching member 60 toward the blocking pieces 27. Therefore, the hooks 64 are engaged in the corresponding latching holes 82. The male connector 84 passes through the opening 67 and the through hole 229, to connect the female connector of the electronic device. The power module 80 is supported on the sliding plate 62 and the supporting block 226.

Figure 7:
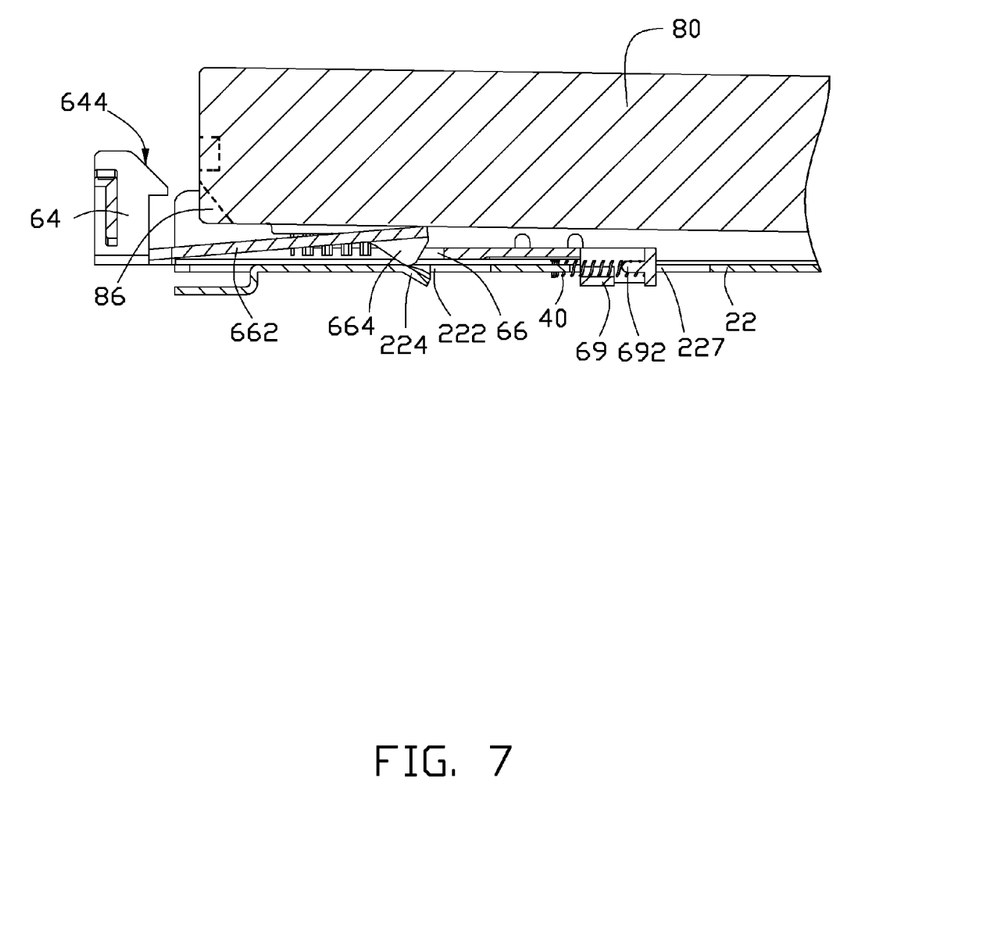
FIGS. 7-8 are partial, cross-sectional views showing the processes of disassembling the power module of FIG. 6.
Figure 8:
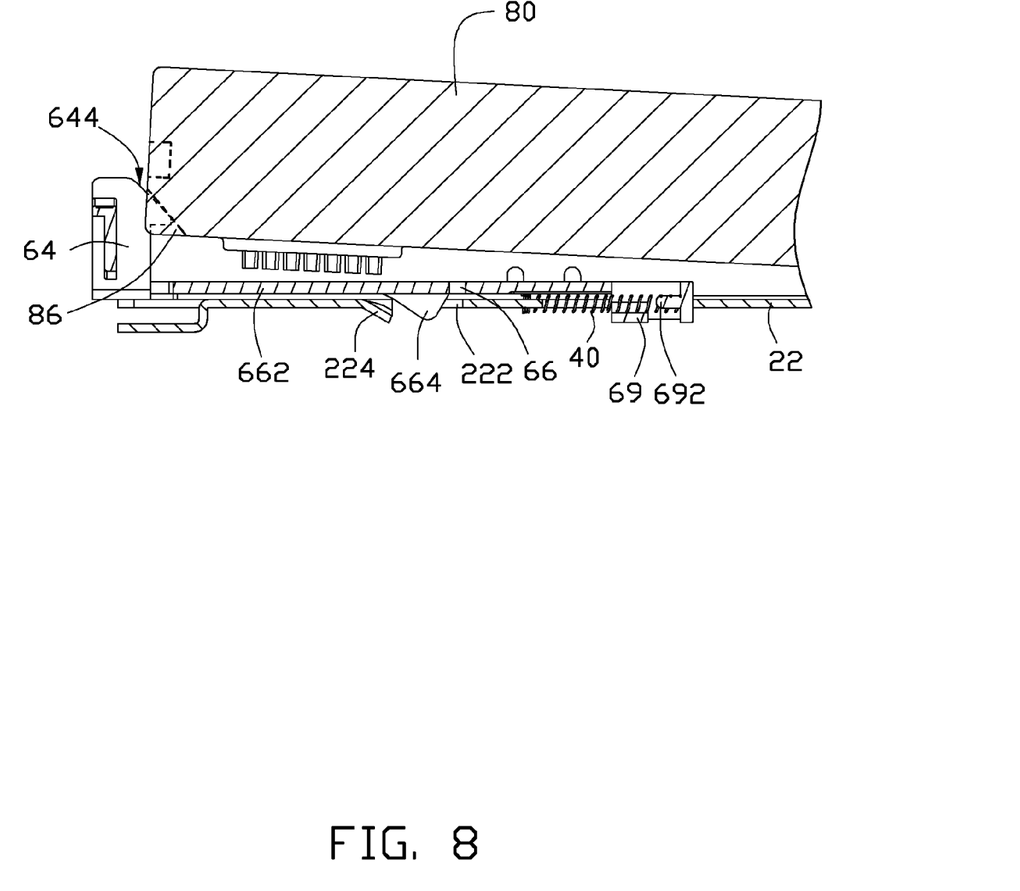

Referring to FIGS. 7 and 8, when disassembling the power module 80, the operation portion 65 is pulled to move away from the power module 80, thereby deforming the resilient member 40. The hooks 64 are disengaged from the corresponding latching holes 82. The operation portion 65 is further pulled, the abutting block 664 slidably abuts against the slope 224, to deform the tongue 662 to raise the power module 80. The power module 80 is pushed up away from the supporting rack 20, until the male connector 84 is detached from the female connector of the electronic device. The operation portion 65 is released, the tongue 662 and the resilient member 40 are restored to urge the latching member 60 to return. The guiding surfaces 644 of the hooks 64 slidably abut against the bottom walls of the corresponding guiding slots 86. The power module 80 is then further pushed up, until the tabs 242 and 262 abut against the end wall of the corresponding cutouts 68. Therefore, the power module 80 may be easily separated from the supporting rack 20.

It is to be understood, however, that even though numerous characteristics and advantages of the embodiments have been set forth in the foregoing description, together with details of the structure and function of the embodiments, the present disclosure is illustrative only, and changes may be made in details, especially in the matters of shape, size, and arrangement of parts within the principles of the embodiments to the full extent indicated by the broad general meaning of the terms in which the appended claims are expressed.

What is claimed is:

1. A fixing device for a power module, comprising:
a supporting rack comprising a base, and a blocking piece formed at a first end of the base for blocking a first end of the power module, the base defining a receiving hole in a second end of the base, a protrusion extending down from the base adjacent to a side of the receiving hole opposite to the blocking piece, a slope facing the receiving hole formed on the protrusion;
a latching member comprising a sliding plate slidably mounted to the base, a hook extending up from the sliding plate to detachably engage in a latching hole defined in a second end of the power module, a resilient tongue extending from the sliding plate, an abutting block extending down from a distal end of the tongue; and
a resilient member connected between the supporting rack and the latching member, to bias the latching member to make the hook engage in the latching hole, wherein when the latching member is slid relative to the base in a first direction, the hook is detached from the latching hole, the abutting block slidably abuts against the slope to move up away from the base, the tongue is deformed to push up the power module to separate the power module from the supporting rack.

2. The fixing device of claim 1, wherein the sliding plate defines an opening through which a connector of the power module extends, the base defines a through hole through which the connector of the power module extends.

3. The fixing device of claim 1, wherein a guiding surface is formed on a top of the hook, facing the first end of the supporting rack.

4. The fixing device of claim 1, wherein the supporting rack further comprises a first sidewall extending up from a first side of the base, and a second sidewall extending up from a second side of the base opposite to the first sidewall, the blocking piece extends from the first sidewall or the second sidewall.

5. The fixing device of claim 4, wherein a first tab extends in from the first sidewall adjacent to the second end of the base, and a second tab extends in from the second sidewall adjacent to the receiving hole, the first and second tabs and the base cooperatively bound two slide slots for slidably receiving opposite sides of the sliding plate.

6. The fixing device of claim 5, wherein the sliding plate defines a first cutout in one of the sides of the sliding plate, and defines a second cutout in the other one of the sides of the sliding plate, a sliding tab extends out from an end of a bottom wall of each cutout adjacent to the hook, the sliding tabs are slidably received in the corresponding slide slots.

7. The fixing device of claim 1, wherein the base defines a guiding slot, a pin protrudes into the guiding slot from an end wall bounding the guiding slot adjacent to the hook, an installing portion extends from the sliding plate away from the hook, the installing portion slidably received in the guiding slot, the resilient member comprises a first end fitting about the pin, and a second end received in the installing portion, and the resilient member provides a force to urge the latching member to move in a second direction, opposite to the first direction, to keep the hook engaged in a latching hole.

8. The fixing device of claim 1, wherein the latching member further comprises an operation portion formed on the sliding plate adjacent to the hook.

9. A power module assembly, comprising:
a power module comprising a first end, and a second end opposite to the first end, the second end defining a latching hole;
a supporting rack comprising a base, and a blocking piece formed at a first end of the base to block the first end of the power module, the base defining a receiving hole in a second end of the base, a protrusion extending down from the base adjacent to a side of the receiving hole opposite to the blocking piece, a slope facing the receiving hole formed on the protrusion;
a latching member comprising a sliding plate slidably mounted to the base, a hook extending up from the sliding plate to detachably engage in the latching hole of the power module, and a resilient tongue extending from the sliding plate, an abutting block extending down from a distal end of the tongue; and
a resilient member connected between the supporting rack and the latching member, to bias the latching member to make the hook engage in the latching hole, wherein when the latching member is slid relative to the base in a first direction, the hook is detached from the latching hole, the abutting block slidably abuts against the slope to move up away from the base, the tongue is deformed to push up the power module to separate the power module from the supporting rack.

10. The power module assembly of claim 9, wherein the power module comprises a connector, the sliding plate defines an opening, the base defines a through hole, the connector extends through the opening and the through hole.

11. The power module assembly of claim 9, wherein a guiding surface is formed on a top of the hook, facing the first end of the supporting rack, a junction of a bottom and the second end of the power module forms a guiding slot with a slanted bottom wall, the hook slidably abuts against the bottom wall of the guiding slot to be deformed away from the power module when assembling the power module.

12. The power module assembly of claim 9, wherein the supporting rack further comprises a first sidewall extending up from a first side of the base, and a second sidewall extending up from a second side of the base opposite to the first sidewall, the blocking piece extends in from the first sidewall or the second sidewall.

13. The power module assembly of claim 12, wherein a first tab extends in from the first sidewall adjacent to the second end of the base, and a second tab extends in from the second sidewall adjacent to the receiving hole, the first and second tabs and the base cooperatively bound two slide slots for slidably receiving opposite sides of the sliding plate.

14. The power module assembly of claim 13, wherein the sliding plate defines a first cutout in one of the sides of the sliding plate, and defines a second cutout in the other one of the sides of the sliding plate, a sliding tab extends out from an end of a bottom wall of each cutout adjacent to the hook, the sliding tabs are slidably received in the corresponding slide slots.

15. The power module assembly of claim 9, wherein the base defines a guiding slot, a pin protrudes into the guiding slot from an end wall bounding the guiding slot adjacent to the hook, an installing portion extends from the sliding plate away from the hook, the installing portion slidably received in the guiding slot, the resilient member comprises a first end fitting about the pin, and a second end received in the installing portion, and the resilient member provides a force to urge the latching member to move in a second direction, opposite to the first direction, to keep the hook engaged in a latching hole.

16. The power module assembly of claim 9, wherein the latching member further comprises an operation portion formed on the sliding plate adjacent to the hook.

* * * * *